United States Patent
Choi et al.

(10) Patent No.: US 11,158,690 B1
(45) Date of Patent: Oct. 26, 2021

(54) LOW COST MICRO OLED STRUCTURE AND METHOD

(71) Applicant: Facebook Technologies, LLC, Menlo Park, CA (US)

(72) Inventors: Min Hyuk Choi, San Jose, WA (US); Cheonghong Kim, Mountain View, WA (US); Zhiming Zhuang, Sammamish, WA (US)

(73) Assignee: Facebook Technologies, LLC, Menlo Park, CA (US)

( * ) Notice: Subject to any disclaimer, the term of this patent is extended or adjusted under 35 U.S.C. 154(b) by 71 days.

(21) Appl. No.: 16/527,258

(22) Filed: Jul. 31, 2019

Related U.S. Application Data

(60) Provisional application No. 62/808,642, filed on Feb. 21, 2019.

(51) Int. Cl.
| | |
|---|---|
| *H01L 27/32* | (2006.01) |
| *G02B 27/01* | (2006.01) |
| *G06F 3/01* | (2006.01) |
| *H01L 27/12* | (2006.01) |
| *G09G 3/3225* | (2016.01) |

(52) U.S. Cl.
CPC ...... *H01L 27/3244* (2013.01); *G02B 27/0172* (2013.01); *G06F 3/011* (2013.01); *G09G 3/3225* (2013.01); *H01L 27/1218* (2013.01); *G02B 2027/0178* (2013.01); *G09G 2310/0297* (2013.01); *H01L 2227/323* (2013.01)

(58) Field of Classification Search
CPC .................................................. H01L 27/3244
USPC .......................................................... 257/772
See application file for complete search history.

(56) References Cited

U.S. PATENT DOCUMENTS

| | | | |
|---|---|---|---|
| 6,541,908 B1* | 4/2003 | Cheung | H01J 1/304 257/101 |
| 8,264,482 B2 | 9/2012 | Miller et al. | |
| 8,547,309 B2 | 10/2013 | Byun | |
| 9,335,852 B2 | 5/2016 | Lee et al. | |
| 9,368,546 B2 | 6/2016 | Fleck et al. | |
| 2009/0195511 A1* | 8/2009 | Cites | G06F 3/0412 345/173 |
| 2016/0379906 A1* | 12/2016 | Kim | G09G 3/3688 257/48 |
| 2017/0207284 A1 | 7/2017 | Dykaar | |
| 2017/0249885 A1 | 8/2017 | Tamura | |
| 2018/0131926 A1* | 5/2018 | Shanks | H04N 13/383 |
| 2018/0166512 A1* | 6/2018 | Hack | H01L 27/3213 |
| 2018/0190712 A1 | 7/2018 | Xu et al. | |
| 2019/0012007 A1 | 1/2019 | Kim et al. | |

\* cited by examiner

*Primary Examiner* — Ajay Arora
(74) *Attorney, Agent, or Firm* — FisherBroyles, LLP

(57) ABSTRACT

A method of manufacturing a display system includes forming a display element having a display active area over a silicon backplane, forming a display driver integrated circuit (DDIC), and bonding the display element to the display driver integrated circuit (DDIC). The display active area may include a light emitting diode such as an organic light emitting diode (OLED). Separately forming the display and the display circuitry may simplify formation of the OLED and allow for a higher density control interface between the display and the DDIC.

10 Claims, 10 Drawing Sheets

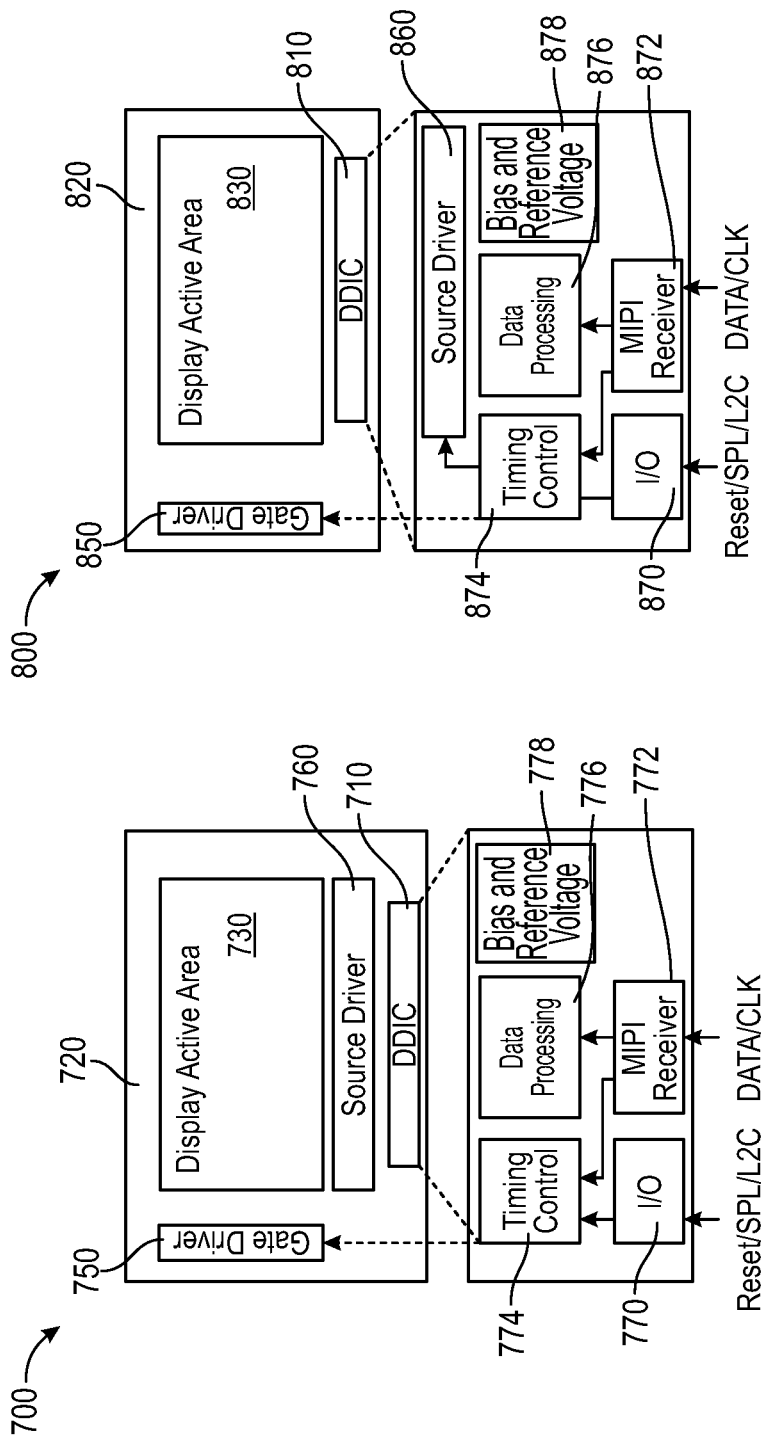

US 11,158,690 B1

LOW COST MICRO OLED STRUCTURE AND METHOD

CROSS-REFERENCE TO RELATED APPLICATION

This application claims the benefit of priority under 35 U.S.C. § 119(e) of U.S. Provisional Application No. 62/808,642, filed Feb. 21, 2019, the contents of which are incorporated herein by reference in their entirety.

BRIEF DESCRIPTION OF THE DRAWINGS

The accompanying drawings illustrate a number of exemplary embodiments and are a part of the specification. Together with the following description, these drawings demonstrate and explain various principles of the instant disclosure.

FIG. 7 depicts a micro-OLED package with various control circuit elements separate from a silicon backplane according to some embodiments.

FIG. 8 shows a micro-OLED package with various control circuit elements, including a source driver, separate from a silicon backplane according to certain embodiments.

Figure 1:
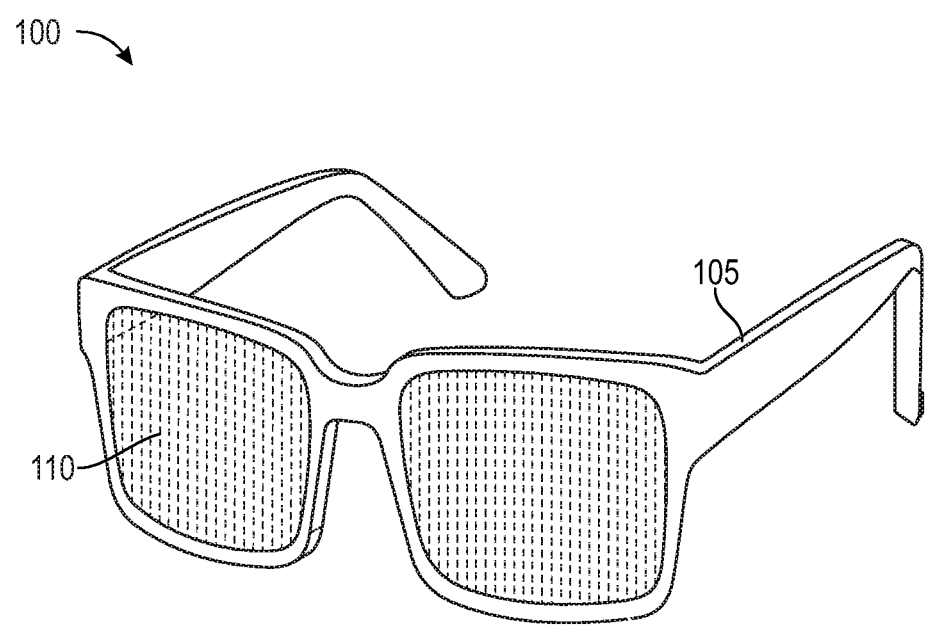
FIG. 1 is a diagram of a head-mounted display (HMD) that includes a near-eye display (NED) according to some embodiments.

Throughout the drawings, identical reference characters and descriptions indicate similar, but not necessarily identical, elements. While the exemplary embodiments described herein are susceptible to various modifications and alternative forms, specific embodiments have been shown by way of example in the drawings and will be described in detail herein. However, the exemplary embodiments described herein are not intended to be limited to the particular forms disclosed. Rather, the instant disclosure covers all modifications, equivalents, and alternatives falling within the scope of the appended claims.

DETAILED DESCRIPTION OF EXEMPLARY EMBODIMENTS

Optical displays are ubiquitous in emerging technologies, including wearable devices, smart phones, tablets, laptops, desktop computers, and other display systems. Many display systems used in such technologies are based on light emitting diodes (LEDs), including organic light emitting diodes (OLEDs). The present disclosure relates generally to display systems and, more specifically, to methods of manufacturing organic light emitting diode (OLED)-based displays, including micro OLED-based displays.

An LED-based display system can be manufactured by assembling an array of individual LED display elements. One or more LED display elements can be grouped to form pixels. The display system may include control circuitry to generate and distribute control signals to control each pixel to project an image. The display system may further include a backplane to provide structural support for the LED display elements and to provide electrical connections to transmit the control signals to the LED display devices. Integration of the LED display elements with the backplane and with additional circuits, such as display driver circuits, can affect pixel-level interconnects, including the size and density of a pixel array, and ultimately the quality and the performance of the display system.

Notwithstanding recent developments, it would be advantageous to provide improved integration and packaging schemes for the economical manufacture of large area, performance-enhanced light emitting diode-based displays. In many comparative OLED architectures, for instance, it may be conventional to integrate the driving electronics onto the backplane, which may beneficially simplify the formation of back end interconnections. However, the foregoing approach may relegate a majority of the display backplane to a display driver integrated circuit (DDIC), which may unduly increase the complexity of circuit design and the associated cost of manufacture.

In view of the foregoing, Applicants have shown that an improved display architecture may be achieved by forming a plurality of pixel transistors on the backplane, while locating a majority of the driver electronics, including the source driver, on a discrete DDIC. In turn, the DDIC may be bonded to the backplane and the attendant transistor circuitry using, for example, a chip-on-flex process in conjunction with a high pitch density (e.g., multiplexer-based) interconnect.

As disclosed herein, a method of manufacturing an LED-based display may include separately forming (i) a display element, including a display active area disposed over a silicon backplane, and (ii) a display driver integrated circuit (DDIC). Once formed, the display element may be bonded to the DDIC using a chip-on-flex (COF) bonding process, for example. In some embodiments, individual LED display elements may include organic light emitting diodes (OLEDs). The disclosed methods and structures may be used to manufacture low cost, high resolution displays having a commercially-relevant form factor (e.g., having one or more lateral dimensions greater than approximately 1.3 inches).

Particularly for higher density displays, by forming the display and the DDIC separately, co-integration challenges may be circumvented such that the overall manufacturing process may be more economical. For instance, and in accordance with various embodiments, the DDIC may be formed at an 80 nm process node, e.g., using conventional CMOS technology, while the display package, including the display elements and the supporting backplane, may be assembled using a less restrictive, lower cost 0.5-1.0 micron process.

In addition, the higher carrier mobility of a single crystal semiconductor backplane (i.e., relative to glass, polymer, or even polycrystalline semiconductors) and the attendant improvements in device operating speed may enable the creation of an increasingly complex data selection interface between the display elements and the display driver circuitry. A higher density data selection interface may enable higher pixel densities within the display active area and higher quality images. For example, the data selection interface may include one or more multiplexers having a ratio of input channels to an output channel of at least 4, e.g., 4, 8, 12, 16, 18, 20, or 24, although still higher density multiplexers are contemplated. According to some embodiments, the instant display systems may include microLEDs as well as micro-OLEDs, and may be incorporated into a variety of form factors, such as wearable near-eye displays (NEDs).

According to various embodiments, a method includes forming a display element including an LED-containing display active area over a silicon backplane, forming a display driver integrated circuit (DDIC), and bonding the display element to the display driver integrated circuit. In some embodiments, in addition to pixel transistors, a gate driver (gate line driving circuit) may be incorporated onto the backplane, whereas a source driver (data line driving circuit) may be incorporated onto the DDIC.

The display element may be electrically connected to the display driver integrated circuit via a multiplexer. In some embodiments, the display element may be attached to a flexible substrate and the display active area electrically connected to the display driver integrated circuit by a wire bond. The foregoing architecture may enable large area displays, including displays having at least one lateral dimension greater than approximately 1.5 inches.

According to further embodiments, a display system may include a display element having an LED-containing (e.g., OLED-containing or micro-OLED-containing) display active area disposed over a silicon backplane, a display driver integrated circuit (DDIC) attached to the display element and electrically connected with the display active area, and a multiplexer disposed between the display element and the display driver integrated circuit. In some embodiments, the display driver integrated circuit may be formed on a flexible substrate.

Features from any of the above-mentioned embodiments may be used in combination with one another according to the general principles described herein. These and other embodiments, features, and advantages will be more fully understood upon reading the following detailed description in conjunction with the accompanying drawings and claims.

In certain embodiments, a method of manufacturing an LED-based display includes forming a display element including a display active area disposed over a silicon backplane, forming a display driver integrated circuit (DDIC), and bonding the display element to the display driver integrated circuit. Thus, the display and the DDIC may be manufactured separately and then joined, i.e., physically bonded and electrically interconnected. Because design rules for the display and the DDIC may not be co-extensive, separate manufacturing paradigms may be used to improve the economics of the overall process. For instance, separate manufacture of the display and the DDIC may decrease the total number of required critical masks and/or increase manufacturing flexibility in one or both sub-processes.

In addition, by using a silicon backplane to form the display, the greater carrier mobility and the associated improvements in operating speed may enable the formation of an increasingly complex data selection interface (i.e., multiplexer interface) between the display element(s) and the display driver circuitry. Higher density multiplexers support the realization of higher pixel densities and higher quality images. For instance, according to some embodiments, a multiplexer may have 4 or more inputs (e.g., 4, 8, 12, 16, 18, 20, 22, 24 or more inputs) for each output.

As will be appreciated, the LED-based displays described herein may include microLEDs. Moreover, the LED-based displays may include organic LEDs (OLEDS), including micro-OLEDs. The LED-based displays may be incorporated into a variety of devices, such as wearable near-eye displays (NEDs).

The following will provide, with reference to FIGS. 1-11, a detailed description of LED devices, systems, and methods of manufacture. The discussion associated with FIGS. 1-3 relates to an example near-eye display (NED). The discussion associated with FIGS. 4-8 includes a description of an OLED and an OLED package in accordance with various embodiments. The discussion associated with FIGS. 9-11 relates to various virtual reality platforms that may include a display device as described herein.

FIG. 1 is a diagram of a near-eye-display (NED) 100, in accordance with some embodiments. The NED 100 may present media to a user. Examples of media that may be presented by the NED 100 include one or more images, video, audio, or some combination thereof. In some embodiments, audio may be presented via an external device (e.g., speakers and/or headphones) that receives audio information from the NED 100, a console (not shown), or both, and presents audio data to the user based on the audio information. The NED 100 is generally configured to operate as a virtual reality (VR) NED. However, in some embodiments, the NED 100 may be modified to also operate as an augmented reality (AR) NED, a mixed reality (MR) NED, or some combination thereof. For example, in some embodiments, the NED 100 may augment views of a physical, real-world environment with computer-generated elements (e.g., images, video, sound, etc.).

The NED 100 shown in FIG. 1 may include a frame 105 and a display 110. The frame 105 may include one or more optical elements that together display media to a user. That is, the display 110 is configured for a user to view the content presented by the NED 100. As discussed below in conjunction with FIG. 2, the display 110 may include at least one source assembly to generate image light to present media to an eye of the user. The source assembly may include, e.g., a source, an optics system, or some combination thereof.

It will be appreciated that FIG. 1 is merely an example of a virtual reality system, and the display systems described herein may be incorporated into further such systems. In some embodiments, FIG. 1 may also be referred to as a Head-Mounted-Display (HMD).

Figure 2:
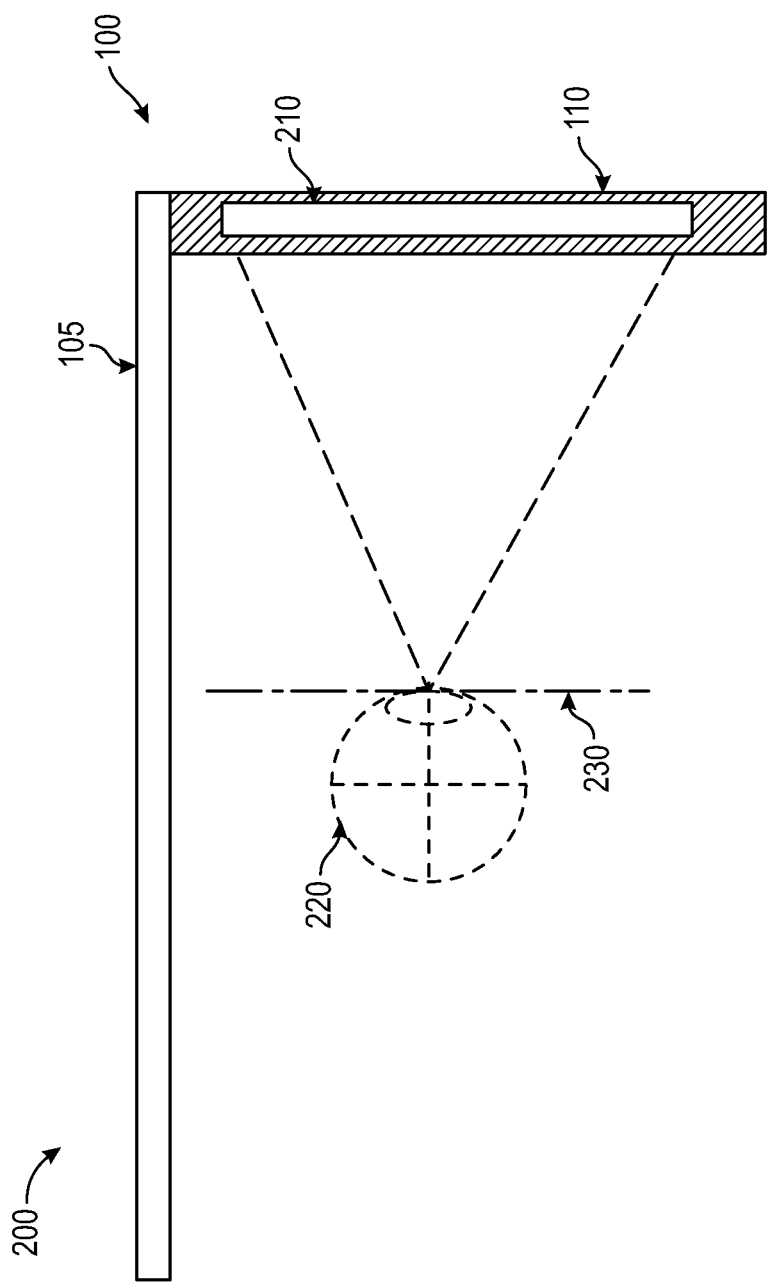
FIG. 2 is a cross-section view of the HMD illustrated in FIG. 1 according to some embodiments.

FIG. 2 is a cross section 200 of the NED 100 illustrated in FIG. 1, in accordance with some embodiments of the present disclosure. The cross section 200 includes at least one display assembly 210, and an exit pupil 230. The exit pupil 230 is a location where the eye 220 may be positioned when the user wears the NED 100. In some embodiments, the frame 105 may represent a frame of eye-wear glasses. For purposes of illustration, FIG. 2 shows the cross section 200 associated with a single eye 220 and a single display assembly 210, but in alternative embodiments not shown, another display assembly that is separate from the display assembly 210 shown in FIG. 2, may provide image light to another eye 220 of the user.

The display assembly 210, as illustrated in FIG. 2, may be configured to direct the image light to the eye 220 through the exit pupil 230. The display assembly 210 may be composed of one or more materials (e.g., plastic, glass, etc.)

with one or more refractive indices that effectively decrease the weight and widen a field of view (hereinafter abbreviated as 'FOV') of the NED 100.

In alternate configurations, the NED 100 may include one or more optical elements (not shown) between the display assembly 210 and the eye 220. The optical elements may act to, by way of various examples, correct aberrations in image light emitted from the display assembly 210, magnify image light emitted from the display assembly 210, perform some other optical adjustment of image light emitted from the display assembly 210, or combinations thereof. Example optical elements may include an aperture, a Fresnel lens, a convex lens, a concave lens, a filter, or any other suitable optical element that may affect image light.

In some embodiments, the display assembly 210 may include a source assembly to generate image light to present media to a user's eyes. The source assembly may include, e.g., a source, an optics system, or some combination thereof.

Figure 3:
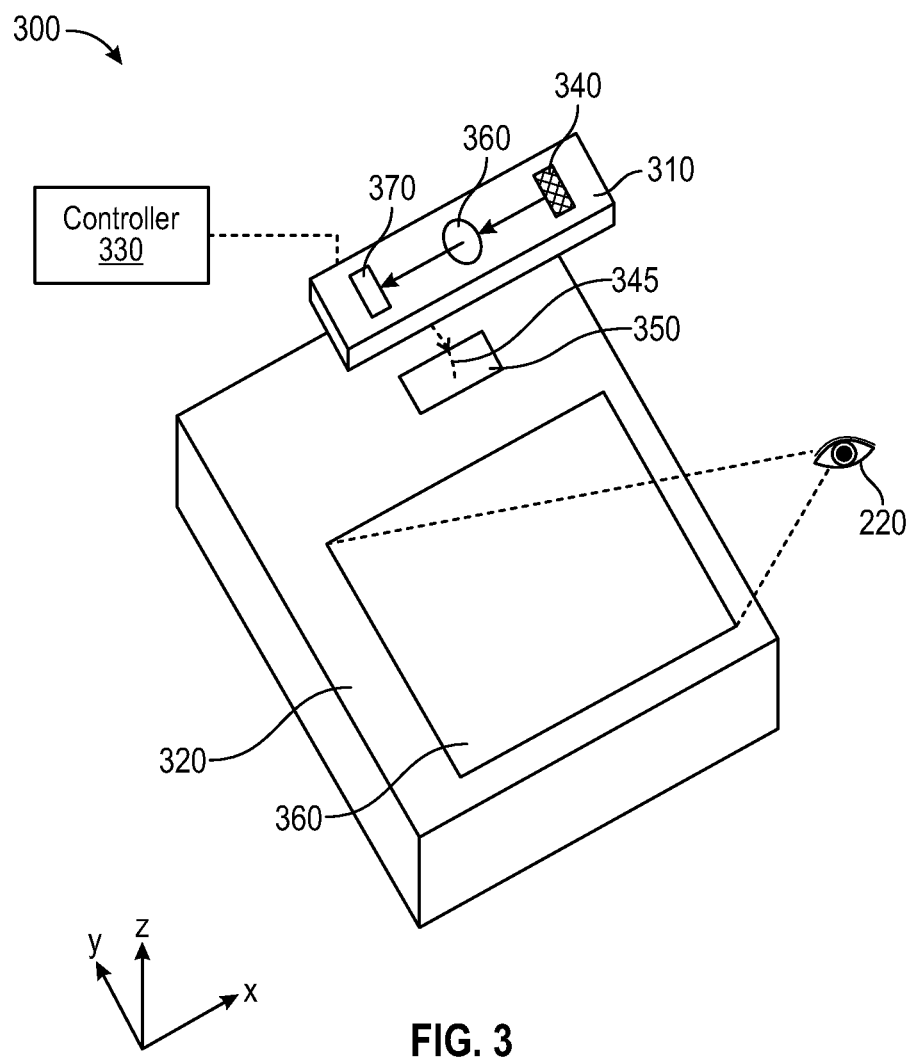
FIG. 3 illustrates an isometric view of a waveguide display in accordance with various embodiments.

FIG. 3 illustrates an isometric view of a waveguide display 300 in accordance with some embodiments. In some embodiments, the waveguide display 300 may be a component (e.g., display assembly 210) of NED 100. In alternate embodiments, the waveguide display 300 may constitute a part of some other NED, or other system that directs display image light to a particular location.

The waveguide display 300 may include a source assembly 310, an output waveguide 320, and a controller 330. For purposes of illustration, FIG. 3 shows the waveguide display 300 associated with a single eye 220, but in some embodiments, another waveguide display separate (or partially separate) from the waveguide display 300 may provide image light to another eye of the user. In a partially separate system, for instance, one or more components may be shared between waveguide displays for each eye.

The source assembly 310 generates image light. The source assembly 310 may include a source 340, a light conditioning assembly 360, and a scanning mirror assembly 370. The source assembly 310 may generate and output image light 345 to a coupling element 350 of the output waveguide 320.

The source 340 may include a source of light that generates at least a coherent or partially coherent image light 345. The source 340 may emit light in accordance with one or more illumination parameters received from the controller 330. The source 340 may include one or more source elements, including, but not restricted to light emitting diodes, such as Micro-OLEDs, as described in detail below with reference to FIGS. 4-8.

The output waveguide 320 may be configured as an optical waveguide that outputs image light to an eye 220 of a user. The output waveguide 320 receives the image light 345 through one or more coupling elements 350, and guides the received input image light 345 to one or more decoupling elements 360. In some embodiments, the coupling element 350 couples the image light 345 from the source assembly 310 into the output waveguide 320. The coupling element 350 may be, for example, a diffraction grating, a holographic grating, some other element that couples the image light 345 into the output waveguide 320, or some combination thereof. For example, in embodiments where the coupling element 350 is a diffraction grating, the pitch of the diffraction grating may be chosen such that total internal reflection occurs, and the image light 345 propagates internally toward the decoupling element 360. For example, the pitch of the diffraction grating may be in the range of 300 nm to 600 nm.

The decoupling element 360 decouples the total internally reflected image light from the output waveguide 320. The decoupling element 360 may be, for example, a diffraction grating, a holographic grating, some other element that decouples image light out of the output waveguide 320, or some combination thereof. For example, in embodiments where the decoupling element 360 is a diffraction grating, the pitch of the diffraction grating may be chosen to cause incident image light to exit the output waveguide 320. An orientation and position of the image light exiting from the output waveguide 320 may be controlled by changing an orientation and position of the image light 345 entering the coupling element 350.

The output waveguide 320 may be composed of one or more materials that facilitate total internal reflection of the image light 345. The output waveguide 320 may be composed of, for example, silicon, plastic, glass, or a polymer, or some combination thereof. The output waveguide 320 may have a relatively small form factor such as for use in a head-mounted display. For example, the output waveguide 320 may be approximately 50 mm wide along an x-dimension, 30 mm long along a y-dimension, and 0.5-1 mm thick along a z-dimension. In some embodiments, the output waveguide 320 may be a planar (2D) optical waveguide.

The controller 330 may be used to control the scanning operations of the source assembly 310. In certain embodiments, the controller 330 may determine scanning instructions for the source assembly 310 based at least on the one or more display instructions. Display instructions may include instructions to render one or more images. In some embodiments, display instructions may include an image file (e.g., bitmap). The display instructions may be received from, e.g., a console of a virtual reality system (not shown). Scanning instructions may include instructions used by the source assembly 310 to generate image light 345. The scanning instructions may include, e.g., a type of a source of image light (e.g. monochromatic, polychromatic), a scanning rate, an orientation of scanning mirror assembly 370, and/or one or more illumination parameters, etc. The controller 330 may include a combination of hardware, software, and/or firmware not shown here so as not to obscure other aspects of the disclosure.

According to some embodiments, source 340 may include a light emitting diode (LED), such as an organic light emitting diode (OLED). An organic light-emitting diode (OLED) is a light-emitting diode (LED) having an emissive electroluminescent layer that may include a thin film of an organic compound that emits light in response to an electric current. The organic layer is typically situated between a pair of conductive electrodes. One or both of the electrodes may be transparent.

As will be appreciated, an OLED display can be driven with a passive-matrix (PMOLED) or active-matrix (AMOLED) control scheme. In a PMOLED scheme, each row (and line) in the display may be controlled sequentially, whereas AMOLED control typically uses a thin-film transistor backplane to directly access and switch each individual pixel on or off, which allows for higher resolution and larger display areas.

Figure 4:
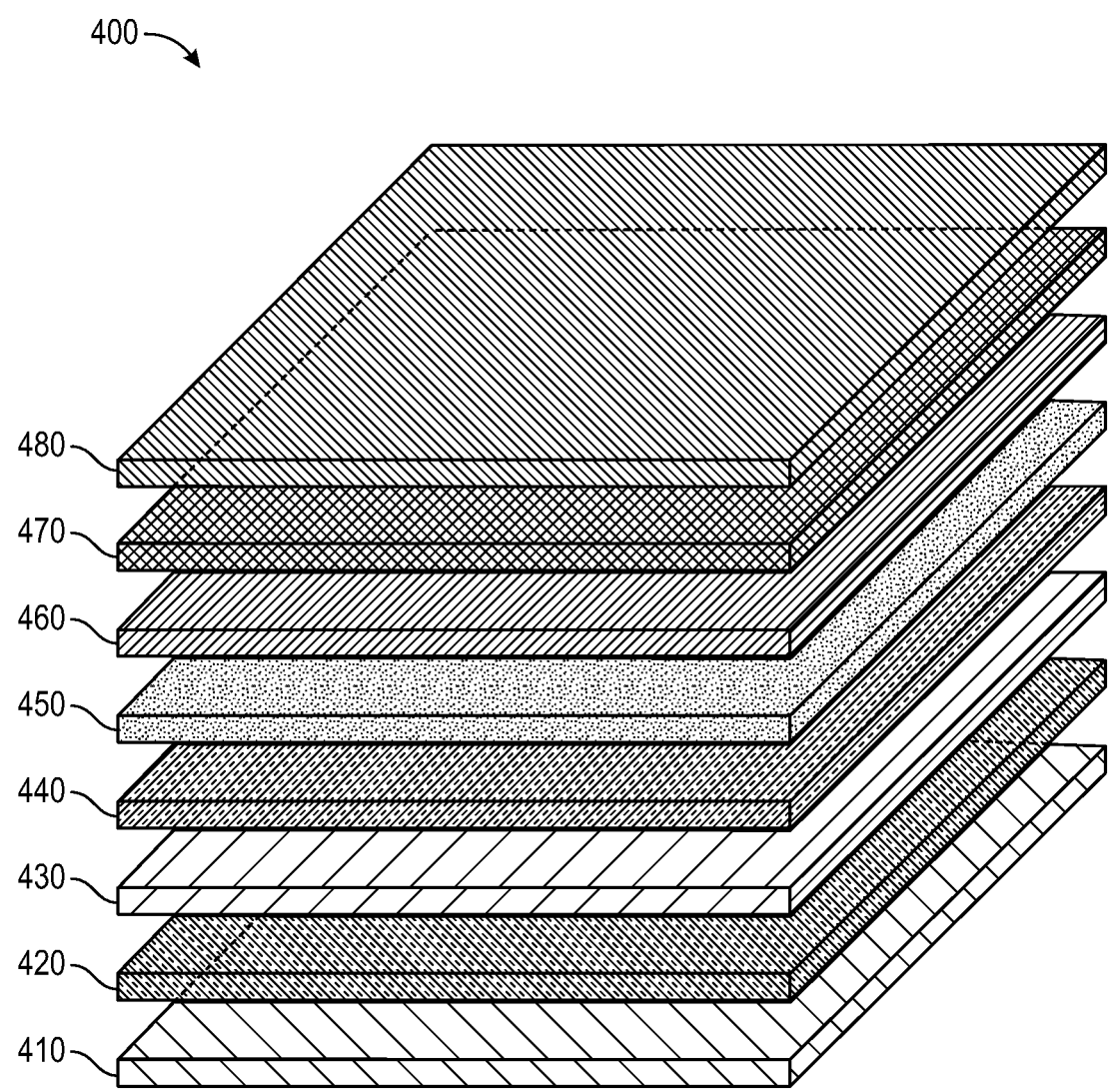
FIG. 4 depicts a simplified OLED structure according to some embodiments.

A simplified structure of an OLED according to some embodiments is depicted in FIG. 4. As shown in an exploded view, OLED 400 may include, from bottom to top, a substrate 410, anode 420, hole injection layer 430, hole transport layer 440, emissive layer 450, blocking layer 460, electron transport layer 470, and cathode 480. In some embodiments, substrate (or backplane) 410 may include single crystal or polycrystalline silicon or other suitable semiconductor (e.g., germanium).

Anode 420 and cathode 480 may include any suitable conductive material(s), such as transparent conductive oxides (TCOs, e.g., indium tin oxide (ITO), zinc oxide (ZnO), and the like). The anode 420 and cathode 480 are configured to inject holes and electrons, respectively, into the organic layer(s) within emissive layer 450 during operation of the device.

The hole injection layer 430, which is disposed over the anode 420, receives holes from the anode 420 and is configured to inject the holes deeper into the device, while the adjacent hole transport layer 440 may support the transport of holes to the emissive layer 450. The emissive layer 450 converts electrical energy to light. Emissive layer 450 may include one or more organic molecules, or light-emitting fluorescent dyes or dopants, which may be dispersed in a suitable matrix.

Blocking layer 460 may improve device function by confining electrons (charge carriers) to the emissive layer 450. Electron transport layer 470 may support the transport of electrons from the cathode 480 to the emissive layer 450.

In some embodiments, the generation of red, green, and blue light (to render full-color images) may include the formation of red, green, and blue OLED sub-pixels in each pixel of the display. Alternatively, the OLED 400 may be adapted to produce white light in each pixel. The white light may be passed through a color filter to produce red, green, and blue sub-pixels.

Any suitable deposition process(es) may be used to form OLED 400. For example, one or more of the layers constituting the OLED may be fabricated using physical vapor deposition (PVD), chemical vapor deposition (CVD), evaporation, spray-coating, spin-coating, atomic layer deposition (ALD), and the like. In further aspects, OLED 400 may be manufactured using a thermal evaporator, a sputtering system, printing, stamping, etc.

According to some embodiments, OLED 400 may be a micro-OLED. A "micro-OLED," according to various examples, may refer to a particular type of OLED having a small active light emitting area (e.g., less than 2,000 $\mu m^2$ in some embodiments, less than 20 $\mu m^2$ or less than 10 $\mu m^2$ in other embodiments). In some embodiments, the emissive surface of the micro-OLED may have a diameter of less than approximately 2 $\mu m$. Such a micro-OLED may also have collimated light output, which may increase the brightness level of light emitted from the small active light emitting area.

Figure 5:
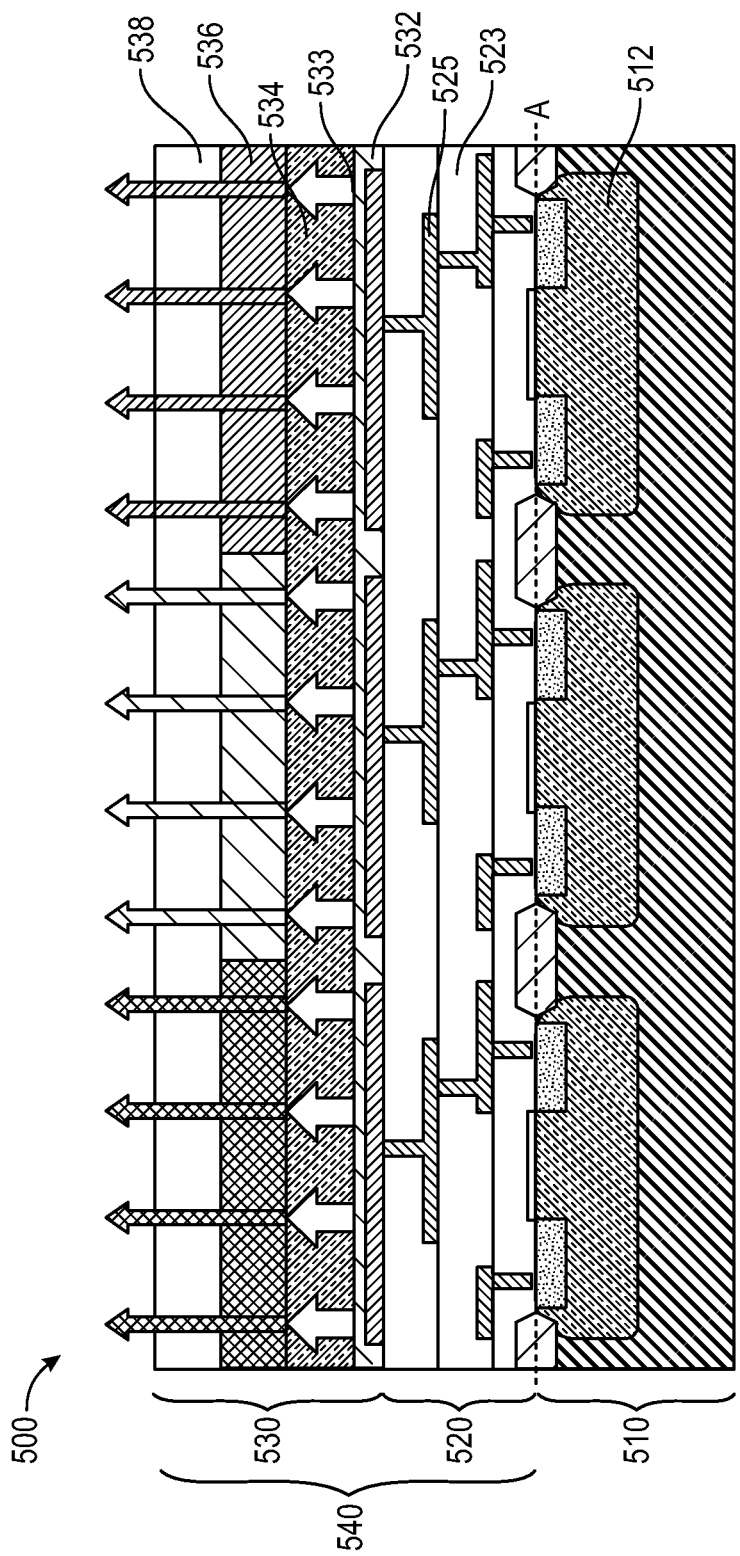
FIG. 5 is a schematic view of an OLED display according to some embodiments.

An example OLED device is shown schematically in FIG. 5. According to some embodiments, OLED device 500 (e.g., micro-OLED chip) may include a display active area 530 having an active matrix 532 (such as OLED 400) disposed over a single crystal (e.g., silicon) backplane 520. The combined display/backplane architecture, i.e., display element 540 may be bonded (e.g., at or about interface A) to a display driver integrated circuit (DDIC) 510. As illustrated, DDIC 510 may include an array of driving transistors 512, which may be formed using conventional CMOS processing as will be appreciated by those skilled in the art. One or more display driver integrated circuits may be formed over a single crystal (e.g., silicon) substrate.

In some embodiments, the display active area 530 may have at least one areal dimension (i.e., length or width) greater than approximately 1.3 inches, e.g., approximately 1.5, 1.75, 2, 2.25, 2.5, 2.75, or 3 inches, including ranges between any of the foregoing values, although larger area displays are contemplated.

Silicon backplane 520 may include a single crystal or polycrystalline silicon layer 523 having a metallization structure 525 for electrically connecting the DDIC 510 with the display active area 530. In some embodiments, display active area 530 may further include, from bottom to top, a transparent encapsulation layer 534 disposed over an upper emissive surface 533 of active matrix 532, a color filter 536, and cover glass 538.

According to various embodiments, the display active area 530 and underlying silicon backplane 520 may be manufactured separately from, and then later bonded to, DDIC 510, which may simplify formation of the OLED active area, including formation of the active matrix 532, color filter 536, etc.

Figure 6:
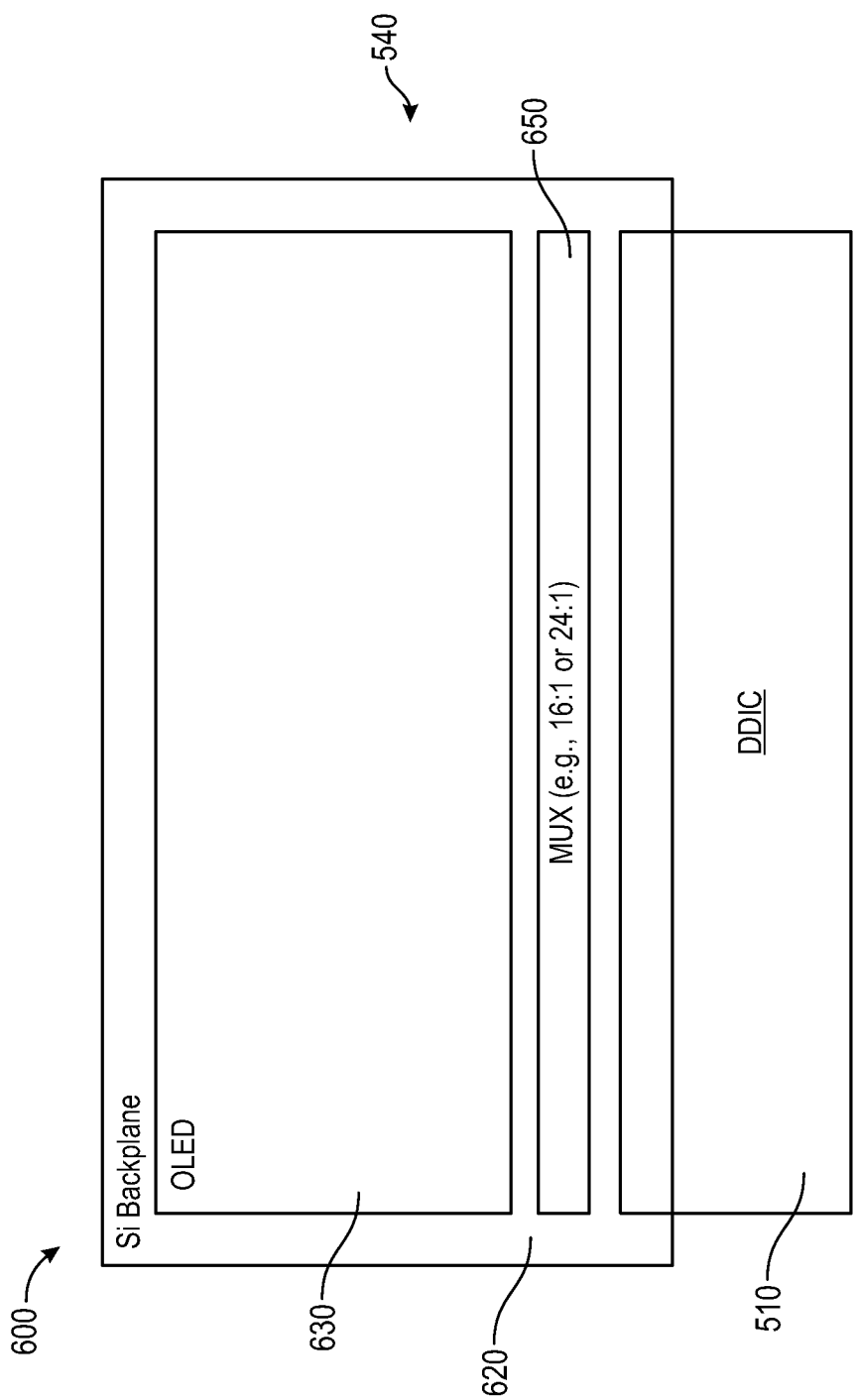
FIG. 6 is a schematic view of a micro-OLED package according to certain embodiments.

According to some embodiments, and with reference to FIG. 6, a chip-on-flex (COF) packaging technology may be used to integrate display element 540 with DDIC 510, optionally via a data selector (i.e., multiplexer) array 650 to form a display 600. In certain embodiments, DDIC 510 may be formed on a flexible substrate.

As used herein, the terms "multiplexer" or "data selector" may, in some examples, refer to a device adapted to combine or select from among plural analog or digital input signals, which are transmitted to a single output. Multiplexers may be used to increase the amount of data that can be communicated within a certain amount of space, time and bandwidth.

As used herein, "chip-on-flex" (COF) may, in some examples, refer to an assembly technology where a microchip or die, such as an OLED chip, is directly mounted on and electrically connected to a flexible circuit, such as a direct driver circuit. In a COF assembly, the microchip may avoid some of the traditional assembly steps used for individual IC packaging. This may simplify the overall processes of design and manufacture while improving performance and yield.

In accordance with certain embodiments, COF assembly may include attaching a die to a flexible substrate, electrically connecting (e.g., wire bonding) the chip to the flex circuit, and encapsulating the chip and wires, e.g., using an epoxy resin to provide environmental protection.

In some embodiments, the adhesive (not shown) used to bond the chip to the flex substrate may be thermally conductive or thermally insulating. In some embodiments, ultrasonic or thermosonic wire bonding techniques may be used to electrically connect the chip to the flex substrate.

Display driver integrated circuits (DDICs), which may also be referred to herein as driver ICs, may receive image data and deliver analog voltages or currents to activate one or more pixels within the display 600. As will be appreciated, driver ICs may include gate drivers and source drivers. In accordance with various embodiments, a gate driver may refer to a power amplifier that accepts a low-power input from a controller IC and produces a high-current drive input for the gate of a transistor, such as an insulated gate bipolar transistor (IGBT) or power metal-oxide-semiconductor field effect transistor (MOSFET). In some embodiments, a gate driver may be configured to turn on and off selected transistors within each pixel cell across a horizontal row of the display area. When the transistors are turned on, a source driver may generate voltages that are applied to each pixel cell on that row for data input. In some embodiments, a source driver may be integrated with a digital-to-analog converter (DAC) for generating analog output voltages from digital input data to drive individual pixels.

Referring to FIG. 7, shown is a micro-OLED display package where various control circuit elements may be removed from the silicon backplane and integrated into the display package via a discrete DDIC. In the embodiment of FIG. 7, display 700 may include a DDIC 710 coupled, e.g., via a multiplexer (not shown) to silicon backplane 720. Each of a display active area 730, gate driver 750, and source driver 760 may be formed over the silicon backplane 720. The DDIC 710, on the other hand, may include I/O interface 770, MIPI receiver 772, timing controller 774, data processing element 776, and bias and reference voltage elements 778.

The MIPI (mobile industry processor interface) receiver 772 may be a MIPI display serial interface (DSO, which may include a high-speed packet-based interface for delivering video data to the display. Timing controller 774 may be configured to receive image data and convert the data format for the source drivers' input. Timing controller 774 may also be configured to generate control signals for the gate and source drivers 750, 760.

According to further embodiments, and with reference to FIG. 8, display 800 may include a DDIC 810 coupled, e.g., via a multiplexer (not shown) to silicon backplane 820. Display active area 830 and gate driver 850 may be formed over the silicon backplane 820, while source driver 860 may be incorporated into the DDIC 810 together with I/O interface 870, MIPI receiver 872, timing controller 874, data processing element 876, and bias and reference voltage elements 878. In certain embodiments, source driver 860 may be formed over a single crystal (e.g., silicon) substrate.

A method of manufacturing a micro-OLED includes separately forming (i) a display active area, including an active matrix disposed over a silicon backplane, and (ii) a display driver integrated circuit (DDIC), which may include a source driver. Once formed, the active display may be bonded to the DDIC using a chip-on-flex (COF) bonding process, for example. The method may be used to manufacture lower cost, higher resolution displays having a commercially-relevant form factor (e.g., lateral dimensions greater than 1.3 inches). Particularly for higher density displays, by forming the display and the DDIC separately, co-integration challenges may be avoided such that the overall manufacturing process may be more economical. For instance, while the DDIC may be formed at an 80 nm process node using CMOS technology, the display package may be assembled using a 50+ micron process node. Furthermore, in conjunction with the higher operating speeds (higher electron mobility) afforded by a silicon backplane (i.e., relative to a polymer or glass backplane), decoupling display manufacture from DDIC manufacture may enable the creation of increasingly complex data selection (multiplexers) at the display-DDIC interface, which supports higher pixel densities and image quality. Finally, in addition to implementation for micro-OLEDs, the instant approach may be applied also to microLEDs.

EXAMPLE EMBODIMENTS

Example 1: A method includes forming a display element having an LED-containing display active area over a silicon backplane, forming a display driver integrated circuit (DDIC), electrically connecting the display active area with the display driver integrated circuit by forming a multiplexer between the display element and the display driver integrated circuit, and bonding the display element to the display driver integrated circuit (DDIC), where the multiplexer includes at least 4 input channels.

Example 2: The method of Example 1, where forming the display element includes forming an organic light emitting diode (OLED) within the display active area.

Example 3: The method of any of Examples 1 and 2, where the organic light emitting diode includes a micro-OLED.

Example 4: The method of any of Examples 1-3, where the silicon backplane includes single crystal silicon.

Example 5: The method of any of Examples 1-4, further including forming the display driver integrated circuit on a flexible substrate.

Example 6: The method of any of Examples 1-5, further including forming a plurality of pixel transistors over the silicon backplane.

Example 7: The method of any of Examples 1-6, further including attaching the display element to a flexible substrate, and electrically connecting the display active area to the display driver integrated circuit.

Example 8: The method of Example 7, where electrically connecting the display active area to the display driver integrated circuit includes wire bonding.

Example 9: The method of any of Examples 1-8, further including forming a gate driver over the silicon backplane.

Example 10: The method of any of Examples 1-9, further including forming a source driver within the display driver integrated circuit.

Example 11: A display system includes (a) a display element having an LED-containing display active area disposed over a silicon backplane, (b) a display driver integrated circuit (DDIC) attached to the display element and electrically connected with the display active area, and (c) a multiplexer disposed between the display element and the display driver integrated circuit, where the multiplexer includes at least 4 input channels.

Example 12: The display system of Example 11, where the display active area includes a micro-OLED.

Example 13: The display system of any of Examples 11 and 12, where the silicon backplane includes single crystal silicon.

Example 14: The display system of any of Examples 11-13, where the display driver integrated circuit is disposed on a flexible substrate.

Example 15: The display system of any of Examples 11-14, where the display active area is electrically connected to the display driver integrated circuit via a wire bond.

Example 16: The display system of any of Examples 11-15, where the display driver integrated circuit includes a source driver.

Example 17: A device includes (a) a display element having a display active area disposed over a single crystal semiconductor backplane, and (b) a display driver integrated circuit (DDIC) bonded to the display element, where the display active area includes a micro-OLED and the display driver integrated circuit includes a source driver.

Example 18: The device of Example 17, further including a plurality of pixel transistors disposed over the backplane.

Example 19: The device of any of Examples 17 and 18, further including a multiplexer communicatively coupling the display element to the display driver integrated circuit.

Example 20: The device of any of Examples 17-19, where the semiconductor backplane includes single crystal silicon.

Embodiments of the present disclosure may include or be implemented in conjunction with various types of artificial reality systems. Artificial reality is a form of reality that has been adjusted in some manner before presentation to a user, which may include, e.g., a virtual reality, an augmented reality, a mixed reality, a hybrid reality, or some combination and/or derivative thereof. Artificial-reality content may include completely generated content or generated content combined with captured (e.g., real-world) content. The artificial-reality content may include video, audio, haptic feedback, or some combination thereof, any of which may be presented in a single channel or in multiple channels (such as stereo video that produces a three-dimensional effect to the viewer). Additionally, in some embodiments, artificial reality may also be associated with applications, products, accessories, services, or some combination thereof, that are used to, e.g., create content in an artificial reality and/or are otherwise used in (e.g., to perform activities in) an artificial reality.

Artificial-reality systems may be implemented in a variety of different form factors and configurations. Some artificial reality systems may be designed to work without near-eye displays (NEDs), an example of which is augmented-reality system 900 in FIG. 9. Other artificial reality systems may include a NED that also provides visibility into the real world (e.g., augmented-reality system 1000 in FIG. 10) or that visually immerses a user in an artificial reality (e.g., virtual-reality system 1100 in FIG. 11). While some artificial-reality devices may be self-contained systems, other artificial-reality devices may communicate and/or coordinate with external devices to provide an artificial-reality experience to a user. Examples of such external devices include handheld controllers, mobile devices, desktop computers, devices worn by a user, devices worn by one or more other users, and/or any other suitable external system.

Figure 9:
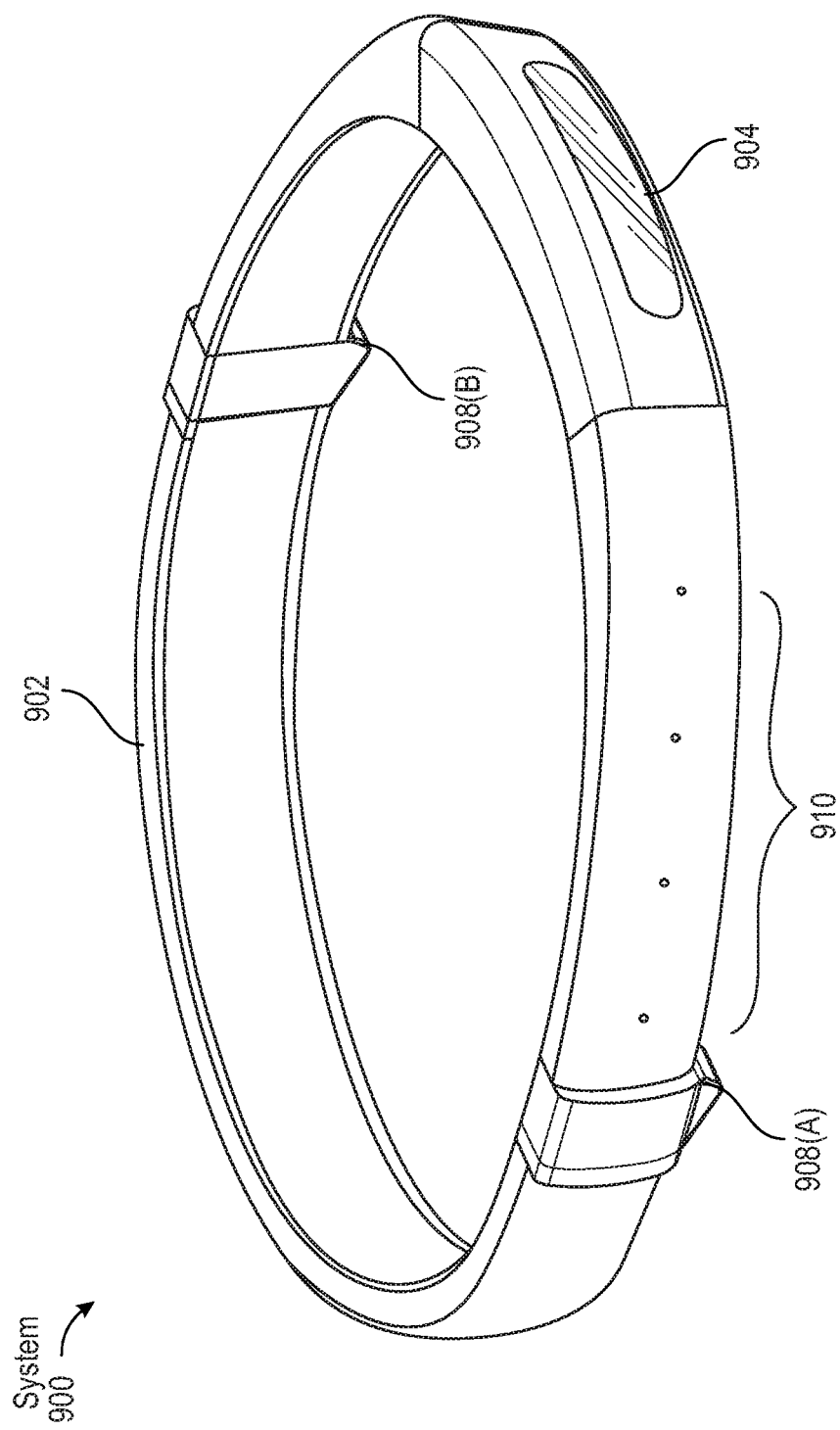
FIG. 9 is an illustration of an exemplary artificial-reality headband that may be used in connection with embodiments of this disclosure.

Turning to FIG. 9, augmented-reality system 900 generally represents a wearable device dimensioned to fit about a body part (e.g., a head) of a user. As shown in FIG. 9, system 900 may include a frame 902 and a camera assembly 904 that is coupled to frame 902 and configured to gather information about a local environment by observing the local environment. Augmented-reality system 900 may also include one or more audio devices, such as output audio transducers 908(A) and 908(B) and input audio transducers 910. Output audio transducers 908(A) and 908(B) may provide audio feedback and/or content to a user, and input audio transducers 910 may capture audio in a user's environment.

As shown, augmented-reality system 900 may not necessarily include a NED positioned in front of a user's eyes. Augmented-reality systems without NEDs may take a variety of forms, such as head bands, hats, hair bands, belts, watches, wrist bands, ankle bands, rings, neckbands, necklaces, chest bands, eyewear frames, and/or any other suitable type or form of apparatus. While augmented-reality system 900 may not include a NED, augmented-reality system 900 may include other types of screens or visual feedback devices (e.g., a display screen integrated into a side of frame 902).

Figure 10:
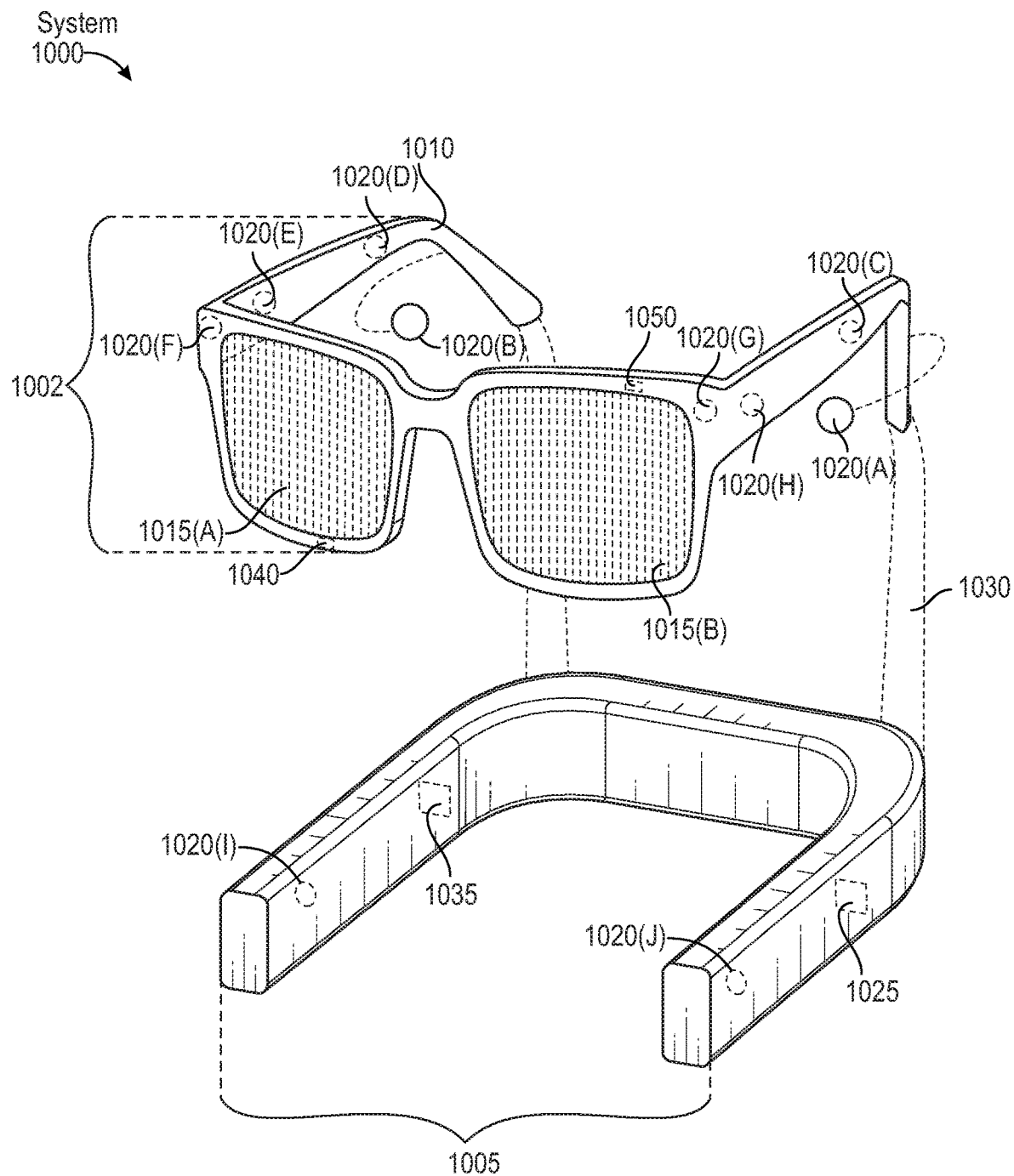
FIG. 10 is an illustration of exemplary augmented-reality glasses that may be used in connection with embodiments of this disclosure.

The embodiments discussed in this disclosure may also be implemented in augmented-reality systems that include one or more NEDs. For example, as shown in FIG. 10, augmented-reality system 1000 may include an eyewear device 1002 with a frame 1010 configured to hold a left display device 1015(A) and a right display device 1015(B) in front of a user's eyes. Display devices 1015(A) and 1015(B) may act together or independently to present an image or series of images to a user. While augmented-reality system 1000 includes two displays, embodiments of this disclosure may be implemented in augmented-reality systems with a single NED or more than two NEDs.

In some embodiments, augmented-reality system 1000 may include one or more sensors, such as sensor 1040. Sensor 1040 may generate measurement signals in response to motion of augmented-reality system 1000 and may be located on substantially any portion of frame 1010. Sensor 1040 may represent a position sensor, an inertial measurement unit (IMU), a depth camera assembly, or any combination thereof. In some embodiments, augmented-reality system 1000 may or may not include sensor 1040 or may include more than one sensor. In embodiments in which sensor 1040 includes an IMU, the IMU may generate calibration data based on measurement signals from sensor 1040. Examples of sensor 1040 may include, without limitation, accelerometers, gyroscopes, magnetometers, other suitable types of sensors that detect motion, sensors used for error correction of the IMU, or some combination thereof.

Augmented-reality system 1000 may also include a microphone array with a plurality of acoustic transducers 1020(A)-1020(J), referred to collectively as acoustic transducers 1020. Acoustic transducers 1020 may be transducers that detect air pressure variations induced by sound waves. Each acoustic transducer 1020 may be configured to detect sound and convert the detected sound into an electronic format (e.g., an analog or digital format). The microphone array in FIG. 10 may include, for example, ten acoustic transducers: 1020(A) and 1020(B), which may be designed to be placed inside a corresponding ear of the user, acoustic transducers 1020(C), 1020(D), 1020(E), 1020(F), 1020(G), and 1020 (H), which may be positioned at various locations on frame 1010, and/or acoustic transducers 1020(1) and 1020(J), which may be positioned on a corresponding neckband 1005.

In some embodiments, one or more of acoustic transducers 1020(A)-(J) may be used as output transducers (e.g., speakers). For example, acoustic transducers 1020(A) and/or 1020(B) may be earbuds or any other suitable type of headphone or speaker.

The configuration of acoustic transducers 1020 of the microphone array may vary. While augmented-reality system 1000 is shown in FIG. 10 as having ten acoustic transducers 1020, the number of acoustic transducers 1020 may be greater or less than ten. In some embodiments, using higher numbers of acoustic transducers 1020 may increase the amount of audio information collected and/or the sensitivity and accuracy of the audio information. In contrast, using a lower number of acoustic transducers 1020 may decrease the computing power required by controller 1050 to process the collected audio information. In addition, the position of each acoustic transducer 1020 of the microphone array may vary. For example, the position of an acoustic transducer 1020 may include a defined position on the user, a defined coordinate on frame 1010, an orientation associated with each acoustic transducer, or some combination thereof.

Acoustic transducers 1020(A) and 1020(B) may be positioned on different parts of the user's ear, such as behind the pinna or within the auricle or fossa. Or, there may be additional acoustic transducers on or surrounding the ear in addition to acoustic transducers 1020 inside the ear canal. Having an acoustic transducer positioned next to an ear canal of a user may enable the microphone array to collect information on how sounds arrive at the ear canal. By positioning at least two of acoustic transducers 1020 on either side of a user's head (e.g., as binaural microphones), augmented-reality device 1000 may simulate binaural hearing and capture a 3D stereo sound field around about a user's head. In some embodiments, acoustic transducers 1020(A) and 1020(B) may be connected to augmented-reality system 1000 via a wired connection 1030, and in other embodiments, acoustic transducers 1020(A) and 1020(B) may be connected to augmented-reality system 1000 via a wireless connection (e.g., a Bluetooth® connection). In still other embodiments, acoustic transducers 1020(A) and 1020(B) may not be used at all in conjunction with augmented-reality system 1000.

Acoustic transducers 1020 on frame 1010 may be positioned along the length of the temples, across the bridge, above or below display devices 1015(A) and 1015(B), or some combination thereof. Acoustic transducers 1020 may be oriented such that the microphone array is able to detect sounds in a wide range of directions surrounding the user wearing the augmented-reality system 1000. In some embodiments, an optimization process may be performed during manufacturing of augmented-reality system 1000 to determine relative positioning of each acoustic transducer 1020 in the microphone array.

In some examples, augmented-reality system 1000 may include or be connected to an external device (e.g., a paired device), such as neckband 1005. Neckband 1005 generally represents any type or form of paired device. Thus, the following discussion of neckband 1005 may also apply to various other paired devices, such as charging cases, smart watches, smart phones, wrist bands, other wearable devices, hand-held controllers, tablet computers, laptop computers and other external computing devices, etc.

As shown, neckband 1005 may be coupled to eyewear device 1002 via one or more connectors. The connectors may be wired or wireless and may include electrical and/or non-electrical (e.g., structural) components. In some cases, eyewear device 1002 and neckband 1005 may operate independently without any wired or wireless connection between them. While FIG. 10 illustrates the components of eyewear device 1002 and neckband 1005 in example locations on eyewear device 1002 and neckband 1005, the components may be located elsewhere and/or distributed differently on eyewear device 1002 and/or neckband 1005. In some embodiments, the components of eyewear device 1002 and neckband 1005 may be located on one or more additional peripheral devices paired with eyewear device 1002, neckband 1005, or some combination thereof.

Pairing external devices, such as neckband 1005, with augmented-reality eyewear devices may enable the eyewear devices to achieve the form factor of a pair of glasses while still providing sufficient battery and computation power for expanded capabilities. Some or all of the battery power, computational resources, and/or additional features of augmented-reality system 1000 may be provided by a paired device or shared between a paired device and an eyewear device, thus reducing the weight, heat profile, and form factor of the eyewear device overall while still retaining desired functionality. For example, neckband 1005 may allow components that would otherwise be included on an eyewear device to be included in neckband 1005 since users may tolerate a heavier weight load on their shoulders than they would tolerate on their heads. Neckband 1005 may also have a larger surface area over which to diffuse and disperse heat to the ambient environment. Thus, neckband 1005 may allow for greater battery and computation capacity than might otherwise have been possible on a stand-alone eyewear device. Since weight carried in neckband 1005 may be less invasive to a user than weight carried in eyewear device 1002, a user may tolerate wearing a lighter eyewear device and carrying or wearing the paired device for greater lengths of time than a user would tolerate wearing a heavy stand-alone eyewear device, thereby enabling users to more fully incorporate artificial reality environments into their day-to-day activities.

Neckband 1005 may be communicatively coupled with eyewear device 1002 and/or to other devices. These other devices may provide certain functions (e.g., tracking, localizing, depth mapping, processing, storage, etc.) to augmented-reality system 1000. In the embodiment of FIG. 10, neckband 1005 may include two acoustic transducers (e.g., 1020(1) and 1020(J)) that are part of the microphone array (or potentially form their own microphone subarray). Neckband 1005 may also include a controller 1025 and a power source 1035.

Acoustic transducers 1020(1) and 1020(J) of neckband 1005 may be configured to detect sound and convert the detected sound into an electronic format (analog or digital). In the embodiment of FIG. 10, acoustic transducers 1020(1) and 1020(J) may be positioned on neckband 1005, thereby increasing the distance between the neckband acoustic transducers 1020(1) and 1020(J) and other acoustic transducers 1020 positioned on eyewear device 1002. In some cases, increasing the distance between acoustic transducers 1020 of the microphone array may improve the accuracy of beamforming performed via the microphone array. For example, if a sound is detected by acoustic transducers 1020(C) and 1020(D) and the distance between acoustic transducers 1020(C) and 1020(D) is greater than, e.g., the distance between acoustic transducers 1020(D) and 1020(E), the determined source location of the detected sound may be more accurate than if the sound had been detected by acoustic transducers 1020(D) and 1020(E).

Controller 1025 of neckband 1005 may process information generated by the sensors on neckband 1005 and/or augmented-reality system 1000. For example, controller 1025 may process information from the microphone array that describes sounds detected by the microphone array. For each detected sound, controller 1025 may perform a direction-of-arrival (DOA) estimation to estimate a direction from which the detected sound arrived at the microphone array. As the microphone array detects sounds, controller 1025 may populate an audio data set with the information. In embodiments in which augmented-reality system 1000 includes an inertial measurement unit, controller 1025 may compute all inertial and spatial calculations from the IMU located on eyewear device 1002. A connector may convey information between augmented-reality system 1000 and neckband 1005 and between augmented-reality system 1000 and controller 1025. The information may be in the form of optical data, electrical data, wireless data, or any other transmittable data form. Moving the processing of information generated by augmented-reality system 1000 to neckband 1005 may reduce weight and heat in eyewear device 1002, making it more comfortable to the user.

Power source 1035 in neckband 1005 may provide power to eyewear device 1002 and/or to neckband 1005. Power source 1035 may include, without limitation, lithium ion batteries, lithium-polymer batteries, primary lithium batteries, alkaline batteries, or any other form of power storage. In some cases, power source 1035 may be a wired power source. Including power source 1035 on neckband 1005 instead of on eyewear device 1002 may help better distribute the weight and heat generated by power source 1035.

As noted, some artificial reality systems may, instead of blending an artificial reality with actual reality, substantially replace one or more of a user's sensory perceptions of the real world with a virtual experience. One example of this type of system is a head-worn display system, such as virtual-reality system 1100 in FIG. 11, that mostly or completely covers a user's field of view. Virtual-reality system 1100 may include a front rigid body 1102 and a band 1104 shaped to fit around a user's head. Virtual-reality system 1100 may also include output audio transducers 1106(A) and 1106(B). Furthermore, while not shown in FIG. 11, front rigid body 1102 may include one or more electronic elements, including one or more electronic displays, one or more inertial measurement units (IMUS), one or more tracking emitters or detectors, and/or any other suitable device or system for creating an artificial reality experience.

Artificial reality systems may include a variety of types of visual feedback mechanisms. For example, display devices in augmented-reality system 1100 and/or virtual-reality system 1100 may include one or more liquid crystal displays (LCDs), light emitting diode (LED) displays, organic LED (OLED) displays, and/or any other suitable type of display screen. Artificial reality systems may include a single display screen for both eyes or may provide a display screen for each eye, which may allow for additional flexibility for varifocal adjustments or for correcting a user's refractive error. Some artificial reality systems may also include optical subsystems having one or more lenses (e.g., conventional concave or convex lenses, Fresnel lenses, adjustable liquid lenses, etc.) through which a user may view a display screen.

In addition to or instead of using display screens, some artificial reality systems may include one or more projection systems. For example, display devices in augmented-reality system 1000 and/or virtual-reality system 1100 may include micro-LED projectors that project light (using, e.g., a waveguide) into display devices, such as clear combiner lenses that allow ambient light to pass through. The display devices may refract the projected light toward a user's pupil and may enable a user to simultaneously view both artificial reality content and the real world. Artificial reality systems may also be configured with any other suitable type or form of image projection system.

Artificial reality systems may also include various types of computer vision components and subsystems. For example, augmented-reality system 900, augmented-reality system 1000, and/or virtual-reality system 1100 may include one or more optical sensors, such as two-dimensional (2D) or three-dimensional (3D) cameras, time-of-flight depth sensors, single-beam or sweeping laser rangefinders, 3D LiDAR sensors, and/or any other suitable type or form of optical sensor. An artificial reality system may process data from one or more of these sensors to identify a location of a user, to map the real world, to provide a user with context about real-world surroundings, and/or to perform a variety of other functions.

Artificial reality systems may also include one or more input and/or output audio transducers. In the examples shown in FIGS. 9 and 11, output audio transducers 908(A), 908(B), 1106(A), and 1106(B) may include voice coil speakers, ribbon speakers, electrostatic speakers, piezoelectric speakers, bone conduction transducers, cartilage conduction transducers, and/or any other suitable type or form of audio transducer. Similarly, input audio transducers 910 may include condenser microphones, dynamic microphones, ribbon microphones, and/or any other type or form of input transducer. In some embodiments, a single transducer may be used for both audio input and audio output.

Figure 11:
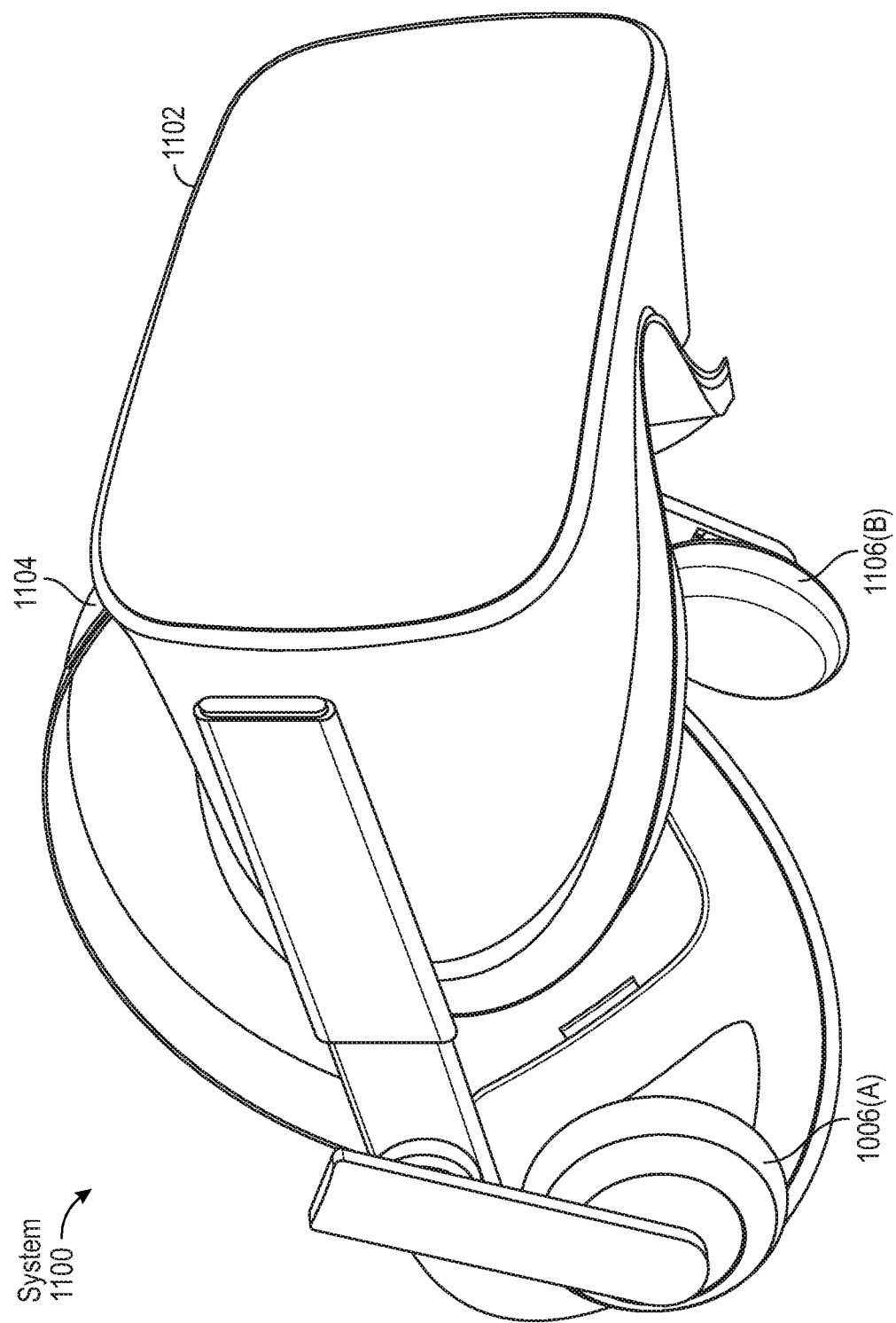
FIG. 11 is an illustration of an exemplary virtual-reality headset that may be used in connection with embodiments of this disclosure.

While not shown in FIGS. 9-11, artificial reality systems may include tactile (i.e., haptic) feedback systems, which may be incorporated into headwear, gloves, body suits, handheld controllers, environmental devices (e.g., chairs, floormats, etc.), and/or any other type of device or system. Haptic feedback systems may provide various types of cutaneous feedback, including vibration, force, traction, texture, and/or temperature. Haptic feedback systems may also provide various types of kinesthetic feedback, such as motion and compliance. Haptic feedback may be implemented using motors, piezoelectric actuators, fluidic systems, and/or a variety of other types of feedback mechanisms. Haptic feedback systems may be implemented independent of other artificial reality devices, within other artificial reality devices, and/or in conjunction with other artificial reality devices.

By providing haptic sensations, audible content, and/or visual content, artificial reality systems may create an entire virtual experience or enhance a user's real-world experience in a variety of contexts and environments. For instance, artificial reality systems may assist or extend a user's perception, memory, or cognition within a particular environment. Some systems may enhance a user's interactions with other people in the real world or may enable more immersive interactions with other people in a virtual world. Artificial reality systems may also be used for educational purposes (e.g., for teaching or training in schools, hospitals, government organizations, military organizations, business enterprises, etc.), entertainment purposes (e.g., for playing video games, listening to music, watching video content, etc.), and/or for accessibility purposes (e.g., as hearing aids, visuals aids, etc.). The embodiments disclosed herein may enable or enhance a user's artificial reality experience in one or more of these contexts and environments and/or in other contexts and environments.

In some examples, the virtual reality systems described and/or illustrated herein, including the associated OLED or LED display systems, may be implemented using any type or form of computing device or system capable of executing computer-readable instructions. In their most basic configuration, these device(s) may each include at least one memory device and at least one physical processor.

In some examples, the term "memory device" generally refers to any type or form of volatile or non-volatile storage device or medium capable of storing data and/or computer-readable instructions. In one example, a memory device may store, load, and/or maintain one or more of the modules described herein. Examples of memory devices include, without limitation, Random Access Memory (RAM), Read Only Memory (ROM), flash memory, Hard Disk Drives (HDDs), Solid-State Drives (SSDs), optical disk drives, caches, variations or combinations of one or more of the same, or any other suitable storage memory.

In some embodiments, the term "computer-readable medium" generally refers to any form of device, carrier, or medium capable of storing or carrying computer-readable instructions. Examples of computer-readable media include, without limitation, transmission-type media, such as carrier waves, and non-transitory-type media, such as magnetic-storage media (e.g., hard disk drives, tape drives, and floppy disks), optical-storage media (e.g., Compact Disks (CDs), Digital Video Disks (DVDs), and BLU-RAY disks), electronic-storage media (e.g., solid-state drives and flash media), and other distribution systems.

In some examples, the term "physical processor," "processing device," or "controller" generally refers to any type or form of hardware-implemented processing unit capable of interpreting and/or executing computer-readable instructions. In one example, a physical processor may access and/or modify one or more modules stored in the above-described memory device. Examples of physical processors include, without limitation, microprocessors, microcontrollers, image processors, Central Processing Units (CPUs), Field-Programmable Gate Arrays (FPGAs) that implement softcore processors, Application-Specific Integrated Circuits (ASICs), portions of one or more of the same, variations or combinations of one or more of the same, or any other suitable physical processor.

In some examples, computer-executable instructions contained within modules may perform one or more of the steps, processes, and/or procedures described and/or illustrated herein. These modules may represent portions of a single module or application. In addition, in certain embodiments one or more of these modules may represent one or more software applications or programs that, when executed by a computing device, may cause the computing device to perform one or more tasks. For example, one or more of the modules described and/or illustrated herein may represent modules stored and configured to run on one or more of the devices or systems described and/or illustrated herein. One or more of these modules may also represent all or portions of one or more special-purpose devices configured to perform one or more tasks.

In addition, one or more of the modules described herein may transform data, physical devices, and/or representations of physical devices from one form to another. Additionally, or alternatively, one or more of the modules recited herein may transform a processor, volatile memory, non-volatile memory, and/or any other portion of a physical computing device from one form to another by executing on the computing device, storing data on the computing device, and/or otherwise interacting with the computing device.

The process parameters and sequence of the steps described and/or illustrated herein are given by way of example only and can be varied as desired. For example, while the steps illustrated and/or described herein may be shown or discussed in a particular order, these steps do not necessarily need to be performed in the order illustrated or discussed. The various exemplary methods described and/or illustrated herein may also omit one or more of the steps described or illustrated herein or include additional steps in addition to those disclosed.

The preceding description has been provided to enable others skilled in the art to best utilize various aspects of the exemplary embodiments disclosed herein. This exemplary description is not intended to be exhaustive or to be limited to any precise form disclosed. Many modifications and variations are possible without departing from the spirit and scope of the instant disclosure. The embodiments disclosed herein should be considered in all respects illustrative and not restrictive. Reference should be made to the appended claims and their equivalents in determining the scope of the instant disclosure.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including" and "having" (and their derivatives), as used in the specification and claims, are interchangeable with and have the same meaning as the word "comprising."

What is claimed is:

1. A display system comprising:
   a display element having an LED-containing display active area disposed over a silicon backplane;
   a discrete display driver integrated circuit (DDIC) that is formed separately from the display element, wherein the DDIC is attached to the display element and is electrically connected with the display active area; and
   a multiplexer disposed between the display element and the discrete display driver integrated circuit,
   wherein a gate line driving circuit is incorporated into the silicon backplane of the display element, and
   wherein a data line driving circuit is incorporated into the DDIC.

2. The display system of claim 1, wherein the display active area comprises a micro-OLED.

3. The display system of claim 1, wherein the silicon backplane comprises single crystal silicon.

4. The display system of claim 1, wherein the display driver integrated circuit is disposed on a flexible substrate.

5. The display system of claim 1, wherein the display active area is electrically connected to the display driver integrated circuit via a wire bond.

6. The display system of claim 1, wherein the display driver integrated circuit comprises a source driver.

7. A device comprising:
   a display element having a display active area disposed over a single crystal semiconductor backplane;
   a discrete display driver integrated circuit (DDIC) that is formed separately from the display element and that is bonded to the display element; and
   a multiplexer disposed between the display element and the discrete display driver integrated circuit,
     wherein a gate line driving circuit is incorporated into the silicon backplane of the display element, and
     wherein a data line driving circuit is incorporated into the DDIC.

8. The device of claim 7, further comprising a plurality of pixel transistors disposed over the backplane.

9. The device of claim 7, wherein the display active area comprises a micro-OLED and the display driver integrated circuit comprises a source driver.

10. The device of claim 7, wherein the semiconductor backplane comprises single crystal silicon.

* * * * *